(12) United States Patent
Miura et al.

(10) Patent No.: US 6,388,492 B2
(45) Date of Patent: May 14, 2002

(54) CLOCK GENERATION CIRCUIT

(75) Inventors: Kiyoshi Miura; Yuki Moriya, both of Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/769,354

(22) Filed: Jan. 26, 2001

(30) Foreign Application Priority Data

Jan. 27, 2000 (JP) ........................................ 2000-023313

(51) Int. Cl.[7] ................................................. G06F 1/04
(52) U.S. Cl. ...................................... 327/291; 327/294
(58) Field of Search ................................. 327/117, 119, 327/291, 116, 294, 299, 147, 156, 157, 162, 218, 217, 225, 231; 331/25, 1 R, 1 A, DIG. 3, 45; 365/233.5

(56) References Cited

U.S. PATENT DOCUMENTS

| | | | | |
|---|---|---|---|---|
| 5,029,135 A | * | 7/1991 | Okubo | 365/233.5 |
| 5,133,064 A | * | 7/1992 | Hotta et al. | 327/156 |
| 5,550,515 A | * | 8/1996 | Liang et al. | 331/1 A |
| 6,072,345 A | * | 6/2000 | Ooishi | 327/157 |
| 6,137,336 A | * | 10/2000 | Baba et al. | 327/295 |
| 6,163,224 A | * | 12/2000 | Araki et al. | 331/45 |
| 6,181,213 B1 | * | 1/2001 | Chang | 331/25 |
| 6,246,275 B1 | * | 6/2001 | Wodnicki et al. | 327/291 |

* cited by examiner

Primary Examiner—Terry D. Cunningham
Assistant Examiner—Linh Nguyen
(74) Attorney, Agent, or Firm—Ronald P. Kananen, Esq.; Rader, Fishman, Grauer, PLLC

(57) ABSTRACT

A clock generation circuit including a multiphase clock generation circuit for generating multiphase clocks of a predetermined frequency, pulse generation circuits for generating a plurality of non-overlap pulses by using at least a part of the multiphase clocks of the multiphase clock generation circuit, and a circuit for obtaining an OR of the plurality of non-overlap pulses of the pulse generation circuits and thereby generating a clock not having a simple whole multiple ratio relationship with respect to a frequency of the multiphase clocks or a clock having a higher frequency without causing an increase of power consumption and an increase of chip area.

18 Claims, 12 Drawing Sheets

EDGE-TRIGGER RS LATCH

DFF WITH ASYCHRONOUS RESET

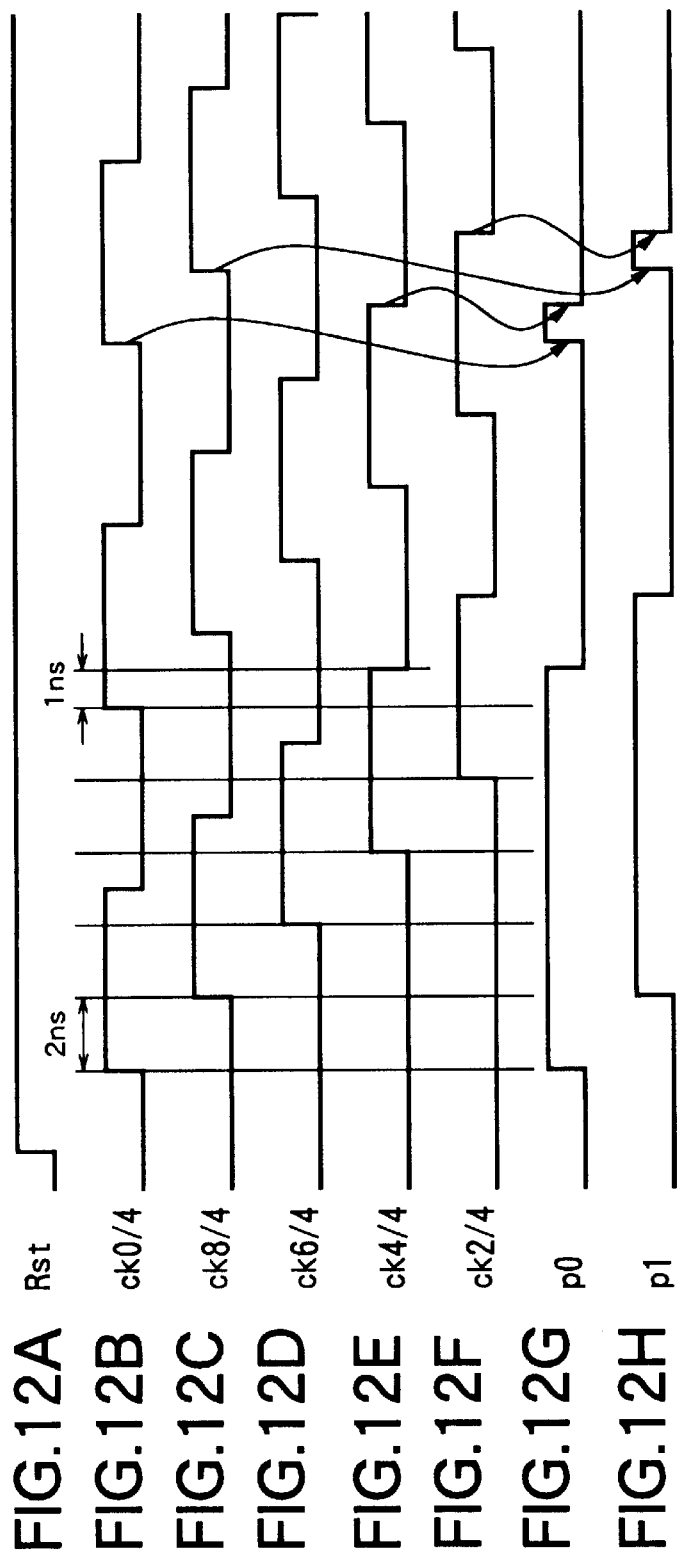

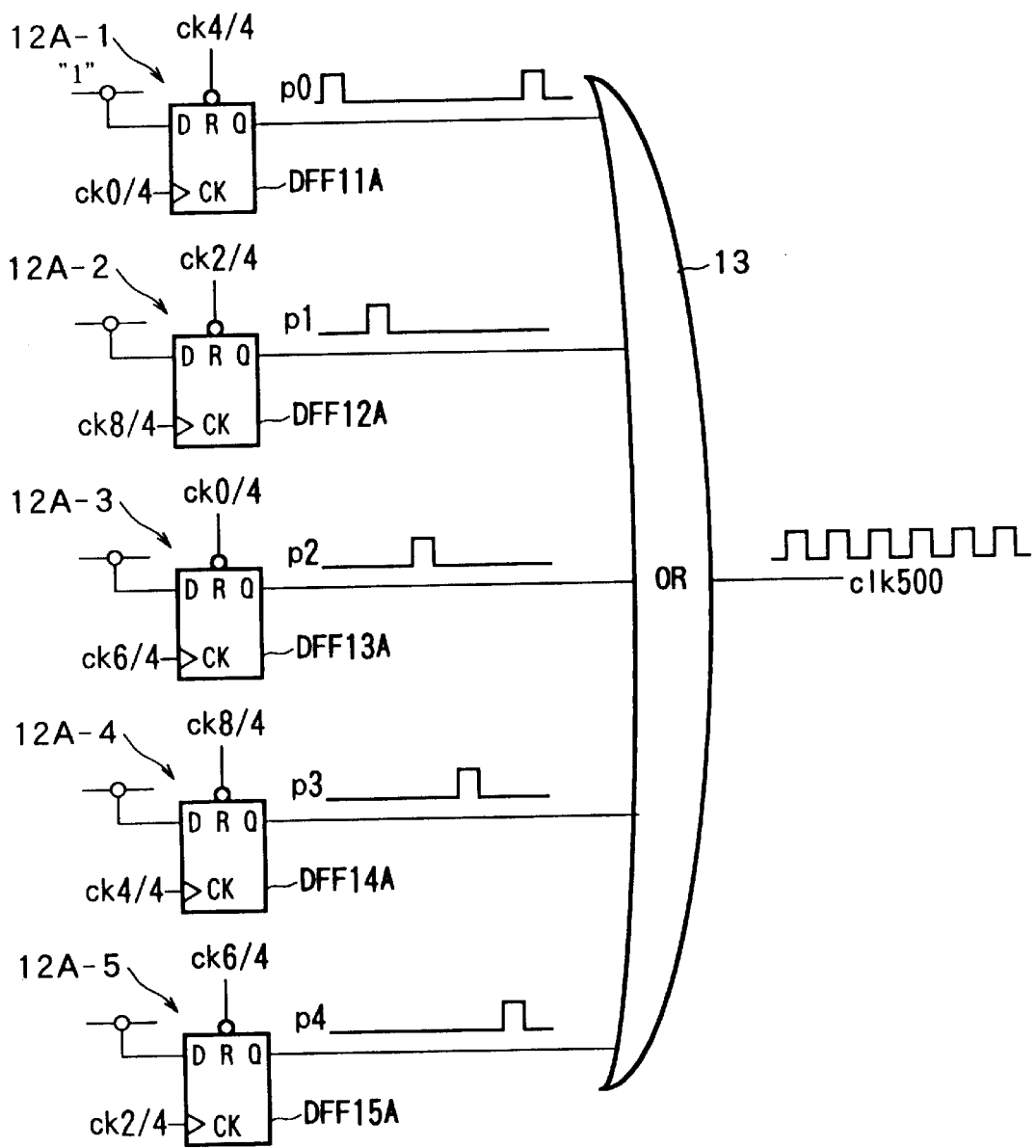

CLOCK GENERATION CIRCUIT

BACKGROUND OF THE INVENTION

1. Field of the Invention

The present invention relates to a clock generation circuit for generating a clock signal of a desired frequency band.

2. Description of the Related Art

As a circuit for generating a plurality of different frequencies, for example, there is known a circuit using a phase locked loop (PLL) circuit etc. to generate a frequency clock of the least common multiple thereof at first and dividing the same by a suitable ratio so as to generate a desired frequency clock.

For example, a 400 MHz clock is required for data-strobe coding in the case of a serial interface IEEE (Institute of Electrical and Electronic Engineers) 1394, particularly for 400 Mbp communication in a system wherein the cable is a long 4.5 m.

In addition to this, a clock of 500 MHz (400×5/4 or ×10/8) is required when increasing the length of a communication cable, for example 100 m, by changing a bit coding format to a 4B/5B system of communicating by changing 4 bits of data to 5 bits of symbols or to a 8B/10B system of communicating by changing 8 bits of data to 10 bits of symbols (work for standardization is actually underway as P1394B in the IEEE).

In a circuit of the related art, a clock having the least common multiple frequency of 2 GHz is generated and the 2 GHz clock is divided by 5 and 4 to generate a 400 MHz clock and a 500 MHz clock, respectively, in this case.

Note that the 4B/5B system and 8B/10B system are generally used in serial communication for the Ethernet or a fiber channel. Thus, the bit rate becomes 5/4 times the data rate.

On the other hand, in the data-strobe system, since data and a strobe (XOR of the data and the clock) are sent separately, the bit rate on a cable becomes the same as the data rate.

However, realization of a circuit for generating a 2 GHz clock is extremely difficult in a device like a 0.4 µm CMOS.

Therefore, it becomes necessary to provide a separate PLL circuit for the 400 MHz and 500 MHz clock. However, this gives rise to the disadvantages of interference between the PLL circuits, an increase of power consumption, and an increase of a layout area due to the two PLL circuits.

SUMMARY OF THE INVENTION

An object of the present invention is to provide a clock generation circuit capable of obtaining a clock output of a desired frequency without causing an increase of power consumption and a chip area.

To attain the above object, according to a first aspect of the present invention, there is provided a clock generation circuit, comprising a multiphase clock generation circuit for generating multiphase clocks of a predetermined frequency, pulse generation circuits for generating a plurality of non-overlap pulses by using at least a part of the multiphase clocks of the multiphase clock generation circuit, and a combining circuit for combining a plurality of non-overlap pulses of the pulse generation circuits to generate a clock having a different frequency from that of the multiphase clocks.

According to a second aspect of the present invention, there is provided a clock generation circuit, comprising a multiphase clock generation circuit having a generation portion for generating reference multiphase clocks having a predetermined frequencies $f_0$, a frequency divider for dividing by a dividing ratio M a frequency of one clock among the reference multiphase clocks of the generation portion, and a shifter for shifting a dividing signal of the frequency divider by a reference multiphase clocks; pulse generation circuits for generating a plurality of non-overlap pulses by using at least a part of the multiphase clocks output by the multiphase clock generation circuit; and a combining circuit for combining a plurality of non-overlap pulses by the pulse generation circuits to compose a clock having a different frequency $f_{out}$ from that of the reference multiphase clocks.

The dividing ratio M of the frequency divider of the multiphase clock generation circuit is preferably set to be value giving a clock equal to the least common multiple of the original frequency $f_0$ and the period sought; the shifter obtains a multiphase clock by shifting by the number of stages required by the original reference multiphase clock having a half phase difference of a period of a frequency $f_{out}$ to be obtained in the combining circuit in that order; and the combining circuit generates a clock satisfying $f_{out}=(f_0/M) \cdot (N/2)$.

The multiphase clock generation circuit preferably comprises a phase synchronization circuit including a phase comparison means for comparing a reference signal with an internal signal and outputting a control signal in accordance with a comparison result and an oscillator, including a basic ring oscillator comprised of a plurality of differential delay circuits adjusted in delay time in accordance with at least the control signal and connected in a ring, generating a multiphase clock based on outputs of a plurality of differential delay circuits.

Alternatively the multiphase clock generation circuit comprises a phase synchronization circuit including a phase comparison means for comparing a reference signal with an internal signal and outputting a control signal in accordance with a comparison result and an oscillator, including a basic ring oscillator comprising an odd number of inverted delay circuits adjusted in delay time in accordance with at least with the control signal and connected in a ring, generating a multiphase clock by dividing outputs of the ring oscillator.

Each of the pulse generation circuits preferably comprises a generation means for generating a non-overlap pulse by being set at a clock edge and reset at another clock edge among the multiphase clocks of the multiphase clock generation circuit.

The generation means preferably comprises an asynchronous reset type flip-flop or an RS-type latch circuit.

The combining circuit preferably comprises an OR circuit.

The OR circuit is comprised of a wired OR circuit having a normally-on load.

That is, according to the present invention, multiphase clocks of a predetermined frequency are generated in the multiphase clock generation circuit and output to the pulse generation circuits.

In the pulse generation circuits, a plurality of non-overlap pulses are generated in the multiphase clock generation circuit by using at least a part of the multiphase clocks of the multiphase clock generation circuit and output to the combining circuit.

In the combining circuit, the plurality of non-overlap pulses of the pulse generation circuits are combined by an OR operation.

As a result, a clock having a different frequency from that of the multiphase clocks is generated.

Alternatively, according to the present invention, in the multiphase clock generation circuit, reference multiphase clocks having a frequency of $f_0$ are generated in a generation portion. One clock among the reference multiphase clocks of the generation portion is supplied to the frequency divider. The clock is divided by a dividing ratio M at the frequency divider. Note that the dividing ratio M is set to a value giving a clock equal to the least common multiple of for example the original frequency $f_0$ and the period sought.

A dividing signal of the frequency divider is shifted by a shifter for the number of stages required by the original reference multiphase clock having for example half a phase difference of a cycle of the frequency $f_{out}$ to be obtained in the combining circuit in that order.

As a result, multiphase clocks having N number of phases are output to the pulse generation circuits.

In the pulse generation circuits, a plurality of non-overlap pulses are generated by using at least a part of the multiphase clocks of the multiphase clock generation circuit and output to the combining circuit.

In the combining circuit, the plurality of non-overlap pulses by the pulse generation circuits are combined by an OR operation.

As a result, a clock having a different frequency $f_{out}=(f_0/M)\cdot(N/2)$ from that of the multiphase clocks is generated.

BRIEF DESCRIPTION OF THE DRAWINGS

These and other objects and features of the present invention will become clearer from the following description of the preferred embodiments given with reference to the accompanying drawings, in which:

FIGS. 12A to 12H are timing charts for explaining a partial operation of FIG. 11; and FIG. 13 is a circuit diagram of an overall clock generation circuit other than a multiphase clock generation circuit at the time of generating a 500 MHz clock from 400 MHz 10-phase clocks.

DESCRIPTION OF THE PREFERRED EMBODIMENTS

Below, preferred embodiments will be described with reference to the accompanying drawings.

Figure 1:
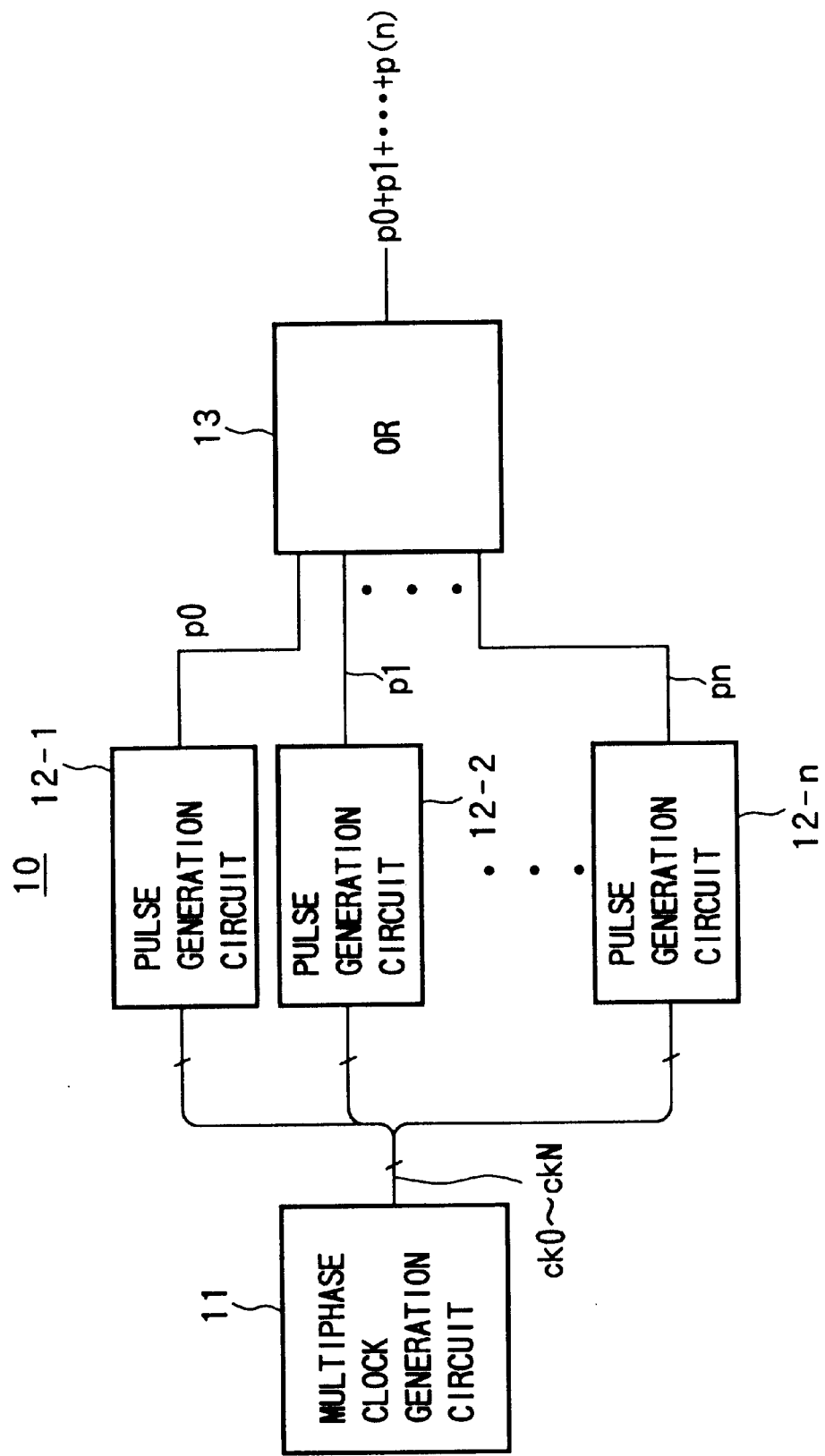
FIG. 1 is a block diagram of an embodiment of a clock generation circuit according to the present invention.

FIG. 1 is a block diagram of an embodiment of a clock generation circuit according to the present invention.

The clock generation circuit 10 comprises as main components a multiphase clock generation circuit 11, pulse generation circuits 12-1 to 12-n (n is a natural number), and an OR circuit 13 serving as a combining circuit.

The multiphase clock generation circuit 11 generates N-phase clocks ck0 to ckN (N is a natural number, for example, N=10 and N≧n) and outputs them to pulse generation circuits 12-1 to 12-n provided corresponding to the number of multiphase clocks.

The number N of multiphase clocks generated by the multiphase clock generation circuit 11 is determined by the relationship with a finally generated clock frequency.

FIGS. 2A to 2J are views of the waveforms of the multiphase clocks generated by the multiphase clock generation circuit 11.

Figure 2:
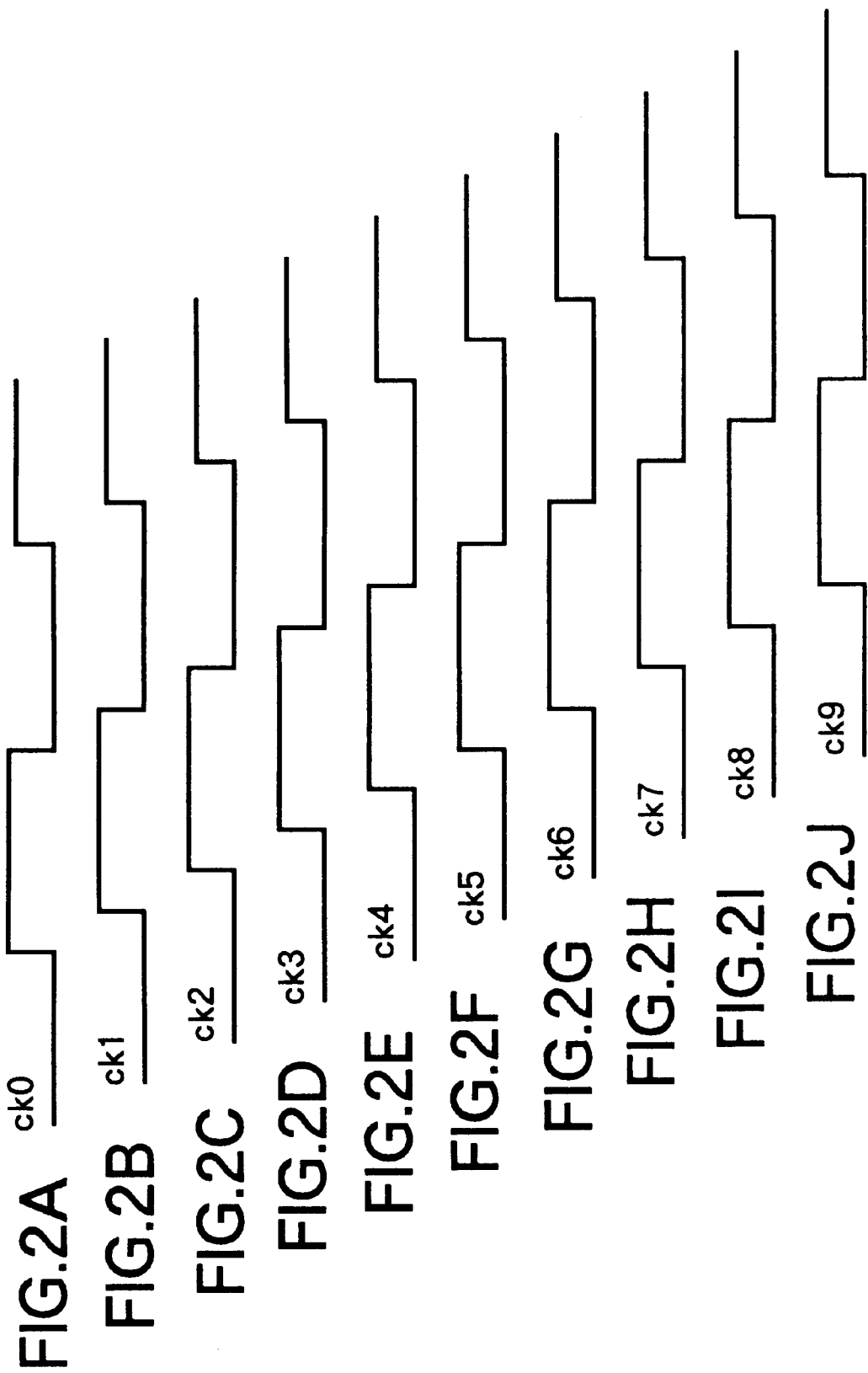
FIGS. 2A to 2J are views of examples of waveforms of multiphase clocks generated by a multiphase clock generation circuit of FIG. 1.

Note that examples of waveforms in the case of 10-phase clocks (N=10) are shown in FIG. 2 for convenience. The invention is of course not limited to 10-phase clocks. As explained above, the required number of phases is determined by the relationship with the finally generated clock frequency.

In the example of FIG. 2, adjacent clocks have a phase difference of exactly 2n/M (M is the number of phases).

Here, on an assumption that 10-phase 400 MHz clocks ck0 to ck9 are obtained in the multiphase clock generation circuit 11, the phase difference of adjacent clocks among the clocks ck0 to ck9 becomes 250 ps (1/400 MHz÷10).

This phase difference is basically the same as the timing information of a clock waveform substantially having a duty ratio of 50% of 2 GHz (period of 500 ps).

Generally, M-phase clocks can be generated by a ring oscillator comprised of M/2 (M/2 is a natural number of 2 or more including both odd and even numbers) number of differential delay circuits.

To obtain a desired frequency, it is sufficient to provide a PLL circuit using such a ring oscillator.

Figure 3:
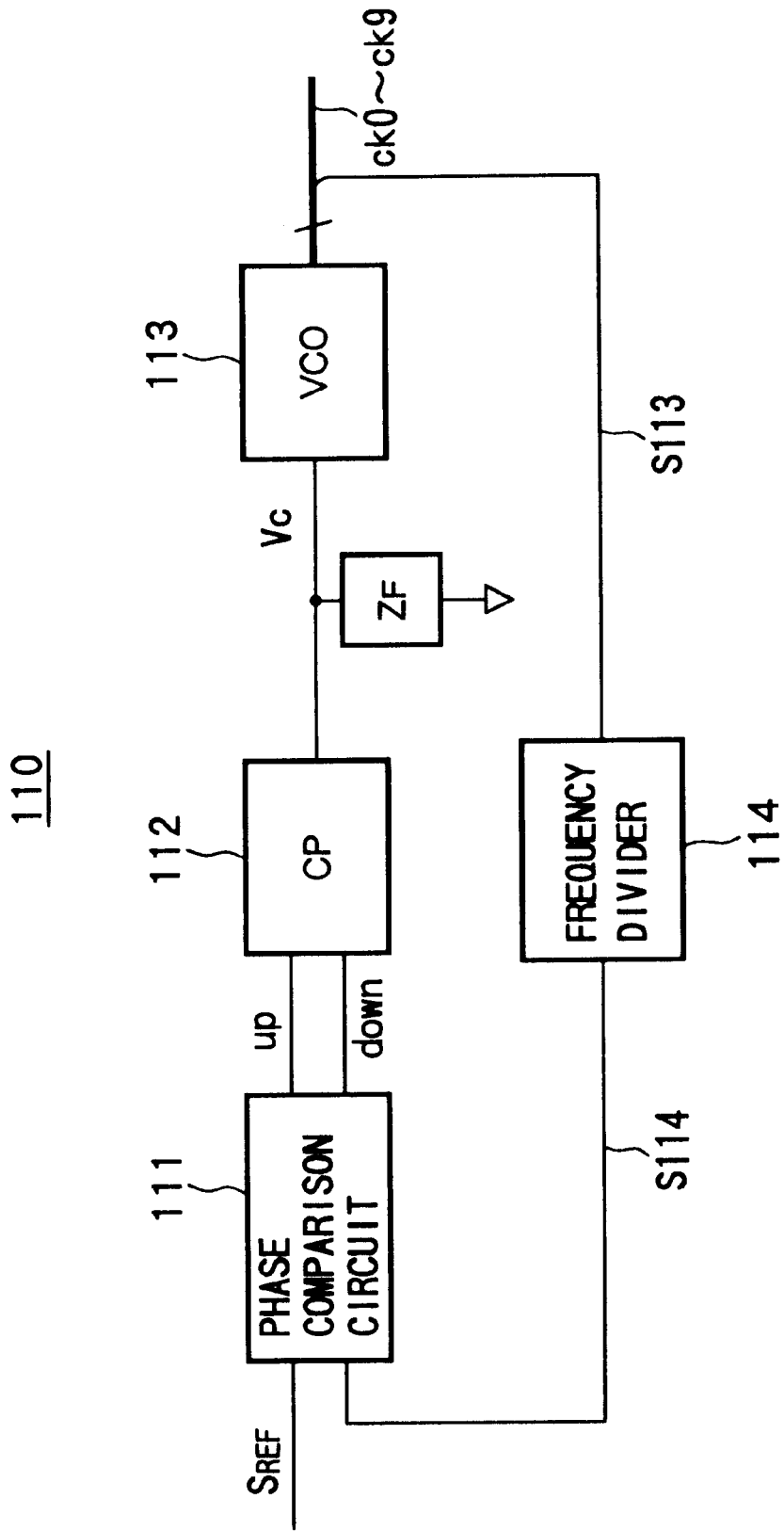
FIG. 3 is a block diagram of an example of the configuration of a PLL circuit for generating multiphase clocks.

FIG. 3 is a block diagram of an example of the configuration of a PLL circuit for generating the multiphase clocks.

Figure 4:
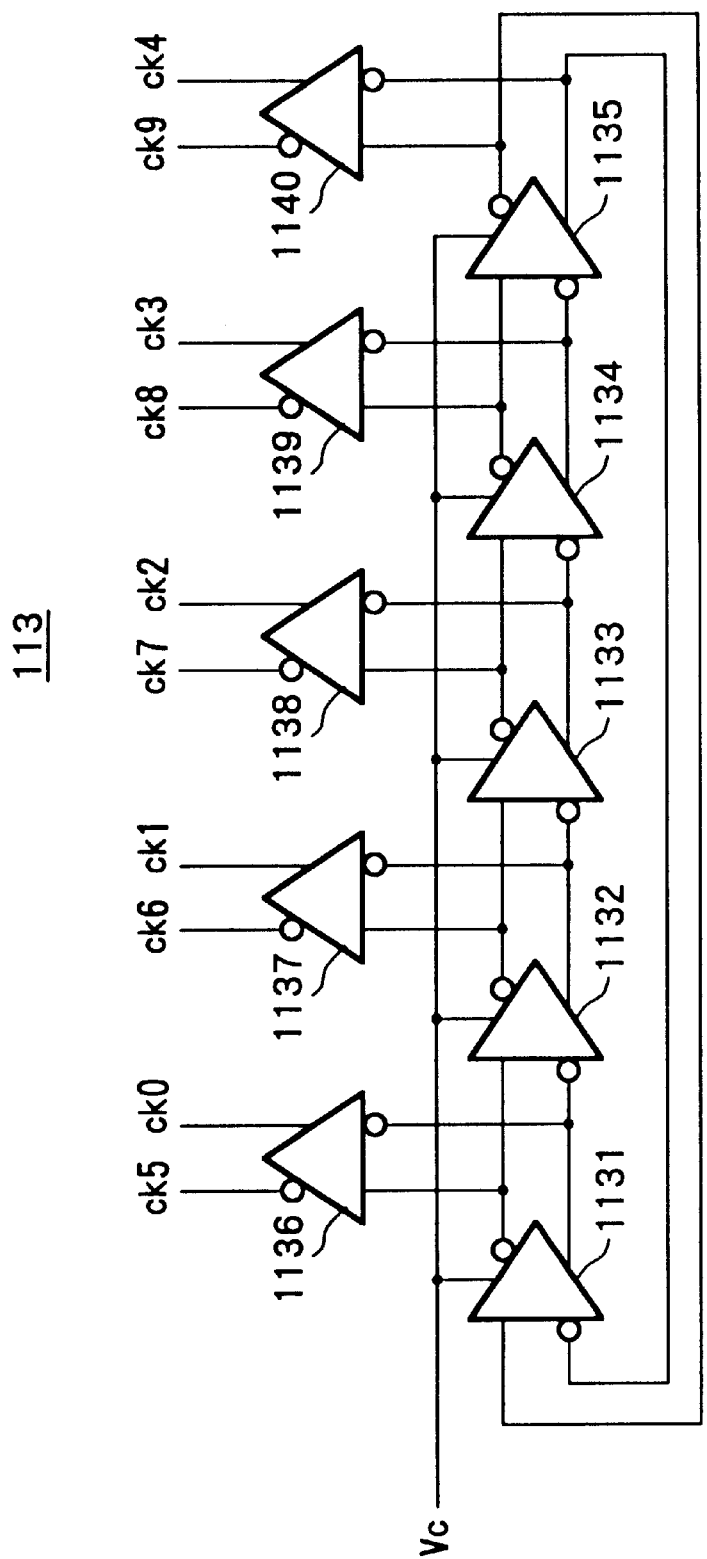
FIG. 4 is a circuit diagram of an example of the configuration of a ring oscillator comprised of differential delay circuits used in the PLL circuit of FIG. 3.

FIG. 4 is a circuit diagram of an example of the configuration of a ring oscillator comprised of differential delay circuits used in a PLL circuit of FIG. 3.

The PLL circuit 110 comprises as main components, as shown in FIG. 3, a phase comparison circuit 111, a charge pump (CP) 112, a voltage controlled oscillator (VCO) 113, and a frequency divider 114.

The VCO 113 is comprised, for example, of a ring oscillator comprised of differential delay circuits as shown in FIG. 4.

In the ring oscillator of FIG. 4, differential inputs/outputs of five differential delay circuits 1131 to 1135 are serially connected (serial connection in a form where negative side and positive side inputs/outputs are alternately connected), and an output of the differential delay circuit 1135 of the final stage (fifth stage) is connected to an input of the differential delay circuit 1131 of the first stage to construct the basic ring oscillator.

A control voltage Vc based on the output of the previous charge pump 112 is supplied to the five differential-delay circuits 1131 to 1135 to control their delay values.

A negative side output terminal of the first differential-delay circuit 1131 is connected to a positive side input terminal of the differential-delay circuit 1136, the positive side thereof is connected to the negative side input terminal, a clock ck0 is output from the positive side output terminal of the differential-delay circuit 1136, and a clock ck5 is output from the negative side output terminal.

Also, a negative side output terminal of the second differential-delay circuit 1132 is connected to a negative side input terminal of the differential-delay circuit 1137, the positive side output terminal thereof is connected to the positive side input terminal, a clock ck1 is output from the positive side output terminal of the differential-delay circuit 1137, and a clock ck6 is output from the positive side output terminal.

Also, a negative side output terminal of the third differential-delay circuit 1133 is connected to the positive side input terminal of the differential-delay circuit 1138, the positive side output terminal thereof is connected to the negative side input terminal, a clock ck2 is output from the positive side output terminal of the differential-delay circuit 1138, and a clock ck7 is output from the negative side output terminal.

A negative side output terminal of the fourth differential-delay circuit 1134 is connected to the positive side input terminal of the differential-delay circuit 1139, a positive side output terminal is connected to the negative side input terminal, a clock ck3 is output from the positive side output terminal of the differential-delay circuit 1139, and a clock ck8 is output from the negative side output terminal.

Also, a negative side output terminal of the fifth differential-delay circuit 1135 is connected to the positive side input terminal of the differential-delay circuit 1140, a positive side output terminal thereof is connected to the negative side input terminal, a clock ck4 is output from the positive side output terminal of the differential-delay circuit 1140, and a clock ck9 is output from the negative side output terminal.

In the PLL circuit 10, the 10-phase clocks ck0 to ck9 are output from the VCO 113 configured as explained above to the pulse generation circuits 12-1 to 12-n.

Then, one clock among the 10-phase clocks ck0 to ck9 is supplied as a signal S113 to the frequency divider 114, and a frequency division signal S114 of the frequency divider 114 is fed-back as an internal signal to the phase comparison circuit 111.

In the phase comparison circuit 111, phases of a reference signal SREF and the signal S114 are compared. In accordance with the comparison result, that is, whether the signal S114 is delayed or advanced with respect to the reference signal SREF, an up signal UP or a down signal DN is output to the charge pump 112.

Then, in the charge pump 112, a current is generated in accordance with the up signal UP or down signal DN, a control voltage Vc based thereon is supplied to the VCO 113, and the 10-phase clocks ck0 to ck9 are generated in the VCO 113 as explained above.

It is also possible to generate multiphase clocks of an even number of phases by dividing an output of a ring oscillator comprised of an odd number of single-end inverted delay circuits (so-called inverters) instead of differential delay circuits.

For example, it is possible to obtain 400 MHz 10-phase clocks from the output of a five-stage 800 MHz ring oscillator.

The pulse generation circuits 12-1 to 12-n use part of the multiphase clocks ck0 to ckN from the multiphase clock generation circuit 11, for example, two consecutive clocks, for generating pulses which do not mutually overlap, that is, non-overlap pulses, p0, p1, p2, . . . pn and output them to the OR circuit 13.

As explained above, when the number of multiphase clocks generated by the multiphase clock generation circuit 11 is 10 (N=10), non-overlap pulses p0 to p4 are generated by the five pulse generation circuits 12-1 to 12-5.

The OR circuit 13 receives the non-overlap pulses p0, p1, p2, . . . pn from the pulse generation circuits 12-1 to 12-n, obtains an OR thereof, and outputs a clock signal having a frequency $f_{out}$ which is different from the frequency of the multiphase clocks.

Here, the configuration of the pulse generation clock will be further explained.

In FIG. 2, by setting high "H" at a rising edge of the clock ck0, resetting to low "L" at a rising edge of the clock ck1, and in the same way, setting at the clock ck2 and resetting at the clock ck3, an equal signal waveform to a clock signal of 2 GHz can be obtained.

Figure 5:
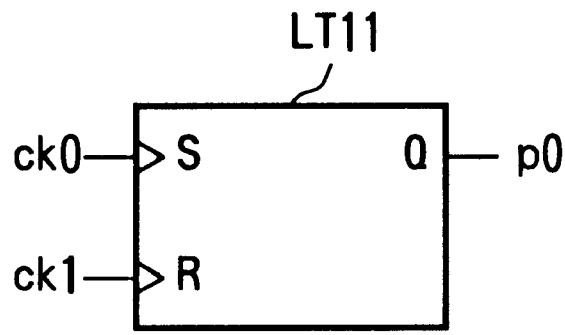
FIG. 5 is a view of an example of a pulse generation circuit according to the present invention comprised of an edge trigger type RS latch.
Figure 6:
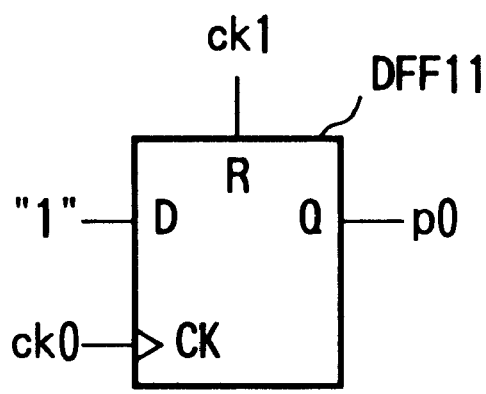
FIG. 6 is a view of an example of a pulse generation circuit according to the present invention comprised of a D-type flip-flop with asynchronous reset.

The setting and resetting operation can be realized by using an edge trigger type RS latch LT11 as shown in FIG. 5 or a D-type flip-flop with asynchronous reset as shown in FIG. 6.

When generating the non-overlap pulse p0 by the latch LT11 shown in FIG. 5, the clock ck0 is supplied to a set terminal S, the next clock ck1 is supplied to a reset terminal R, and the non-overlap pulse p0 is output from a Q-output.

When generating the non-overlap pulse p0 by the flip-flop DFF11 of FIG. 6, a D-input is fixed to a logic "1", the clock ck0 is supplied to the clock terminal CK, the clock ck1 is supplied to the reset terminal R, and the non-overlap pulse p0 is output from the Q-output.

Figure 7:
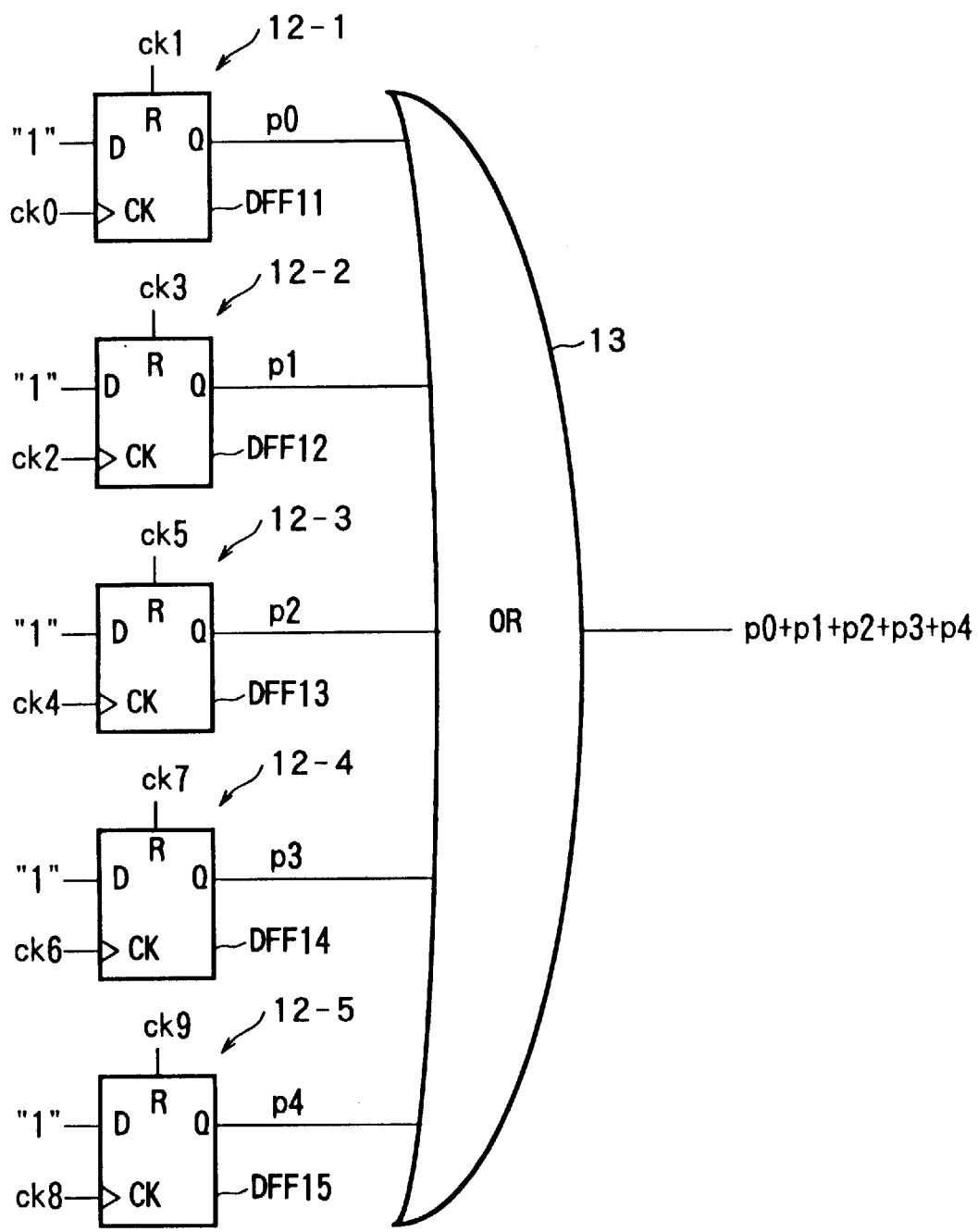
FIG. 7 is a circuit diagram of an overall clock generation circuit other than a multiphase clock generation circuit when a pulse generation circuit according to the present invention is comprised of a D-type flip-flop with asynchronous reset.

FIG. 7 is a circuit diagram of an overall clock generation circuit other than a multiphase clock generation circuit when configuring the pulse generation circuit by a D-type flip-flop with asynchronous reset.

Note that an example of obtaining a 2 GHz clock signal is shown in FIG. 7. Namely, FIG. 7 shows an example of the configuration where 400 MHz 10-phase clocks ck0 to ck9 are generated by the multiphase clock generation circuit and where five (=n) pulse generation circuits are provided.

As shown in FIG. 7, the pulse generation circuits 12-1 to 12-5 are comprised of D-type flip-flops with asynchronous reset DFF11 to DFF15, respectively.

Specifically, in the pulse generation circuit 12-1, the D-input of the flip-flop DFF11 is fixed to a logic of "1", the clock ck0 is supplied to the clock terminal CK, the next clock ck1 is supplied to the reset terminal R, and the non-overlap pulse p0 is output from the Q-output.

In the pulse generation circuit 12-2, the D-input of the flip-flop DFF12 is fixed to a logic of "1", the clock ck2 is supplied to the clock terminal CK, the next clock ck3 is supplied to the reset terminal R, and the non-overlap pulse p1 is output from the Q-output.

In the pulse generation circuit 12-3, the D-input of the flip-flop DFF13 is fixed to a logic of "1", the clock ck4 is supplied to the clock terminal CK, the next clock ck5 is supplied to the reset terminal R, and the non-overlap pulse p2 is output from the Q-output.

In the pulse generation circuit 12-4, the D-input of the flip-flop DFF14 is fixed to a logic of "1", the clock ck6 is supplied to the clock terminal CK, the next clock ck7 is supplied to the reset terminal R, and the non-overlap pulse p3 is output from the Q-output.

In the pulse generation circuit 12-5, the D-input of the flip-flop DFF15 is fixed to a logic of "1", the clock ck8 is supplied to the clock terminal CK, the next clock ck9 is supplied to the reset terminal R, and the non-overlap-pulse p4 is output from the Q-output.

Figure 8:
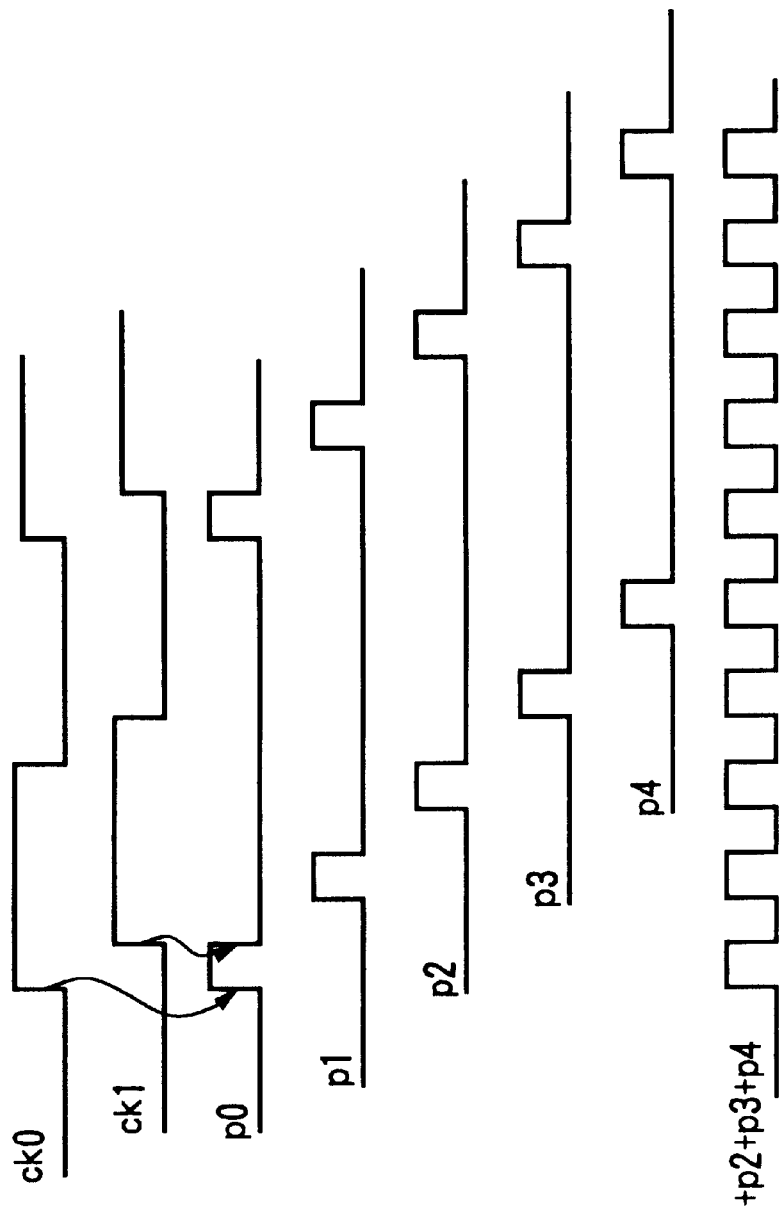
FIGS. 8A to 8H are timing charts for explaining a partial operation of a circuit of FIG. 7 at the time of generating a 2 GHz clock.

Namely, as shown in FIGS. 8A to 8C, the non-overlap pulse p0 is generated by setting at the clock ck0 and resetting at the clock ck1.

In the same way, the pulse p1 is generated by setting at the clock ck2 and resetting at the clock ck3 and so on, whereby a pulse sequence p0, p1, p2, p3, and p4 is obtained.

Since the pulses do not overlap, by obtaining an OR in the OR circuit 13, the "p0+p1+p2+p+p3+p4" becomes a 2 GHz clock waveform.

Figure 9:
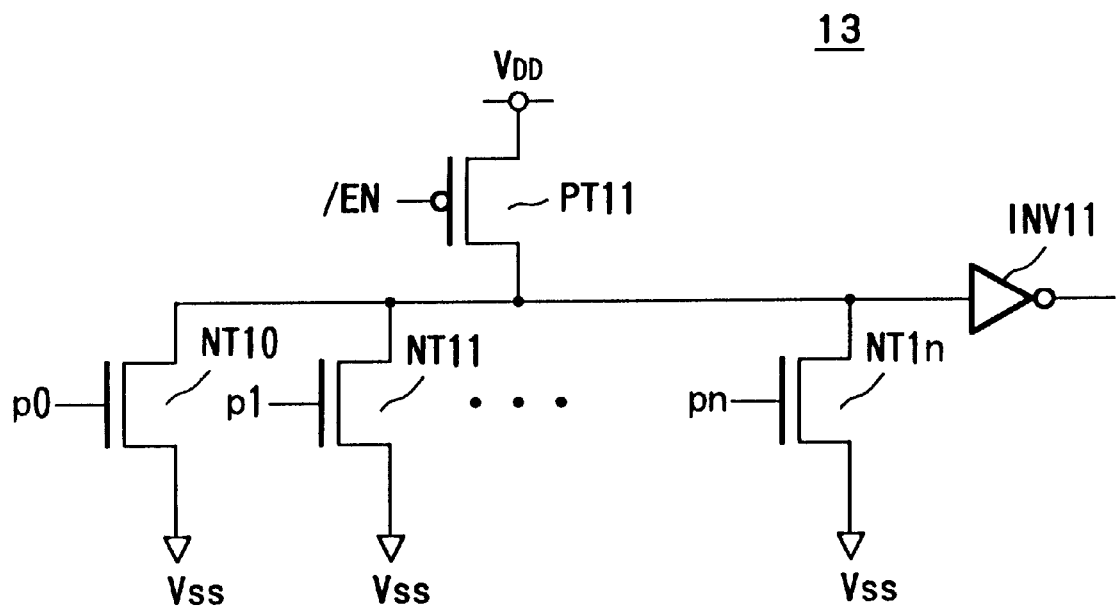
FIG. 9 is a circuit diagram of an example of the configuration of an OR circuit according to the present invention.

FIG. 9 is a circuit diagram of an example of the configuration of the OR circuit 13.

The OR circuit 13 comprises a p-channel MOS (PMOS) transistor PT11, n-channel MOS (NMOS) transistors NT10 to NT1n, and an inverter INV11.

The PMOS transistor PT11 is connected between a supply line of the power source voltage VDD and a node ND11. A gate of the PMOS transistor PT11 is supplied with an enable signal /EN ("/" indicates inversion) which is active at a low level.

Also, the NMOS transistors NT10 to NT1n are connected in parallel between the node ND11 and a reference potential (ground potential) Vss. Gates of the NMOS transistors NT10 to NT1n are supplied with the non-overlap pulses p0 to pn.

The node ND11 is connected to an input terminal of the inverter INV11.

This OR circuit is a wired OR circuit wherein the PMOS transistor PT11 functions as a so-called normally-on load.

Note that a detailed explanation on the circuit operation will be omitted here.

Next, an operation when generating a 2 GHz clock by the clock generation circuit of FIG. 1 will be explained.

First, in the multiphase clock generation circuit 11, for example, 10-phase 400 MHz clocks ck0 to ck9 are generated.

The phase difference between adjacent clocks among ck0 to ck9 is 250 ps (1/400 MHz÷10) or equal to timing information held by a clock waveform having a duty rate of 50% at 2 GHz (period of 500 ps).

Among the 10-phase clocks ck0 to ck9 generated by the multiphase clock generation circuit 11, the clocks ck0 and ck1 are supplied to the pulse generation circuit 12-1, clocks ck2 and ck3 are supplied to the pulse generation circuit 12-2, clocks ck4 and ck5 are supplied to the pulse generation circuit 12-3, clocks ck6 and ck7 are supplied to the pulse generation circuit 12-4, and clocks ck8 and ck9 are supplied to the pulse generation circuit 12-5.

In the pulse generation circuit 12-1, for example, the D-type flip-flop with asynchronous reset DFF11 is set at the clock ck0 and reset at the clock ck1, consequently, the non-overlap pulse p0 is generated.

In the pulse generation circuit 12-2, for example, the D-type flip-flop with asynchronous reset DFF12 is set at the clock ck2 and reset at the clock ck3, consequently, the non-overlap pulse p1 is generated.

In the pulse generation circuit 12-3, for example, the D-type flip-flop with asynchronous reset DFF13 is set at the clock ck4 and reset at the clock ck5, consequently, the non-overlap pulse p2 is generated.

In the pulse generation circuit 12-4, for example, the D-type flip-flop with asynchronous reset DFF14 is set at the clock ck6 and reset at the clock ck7, consequently, the non-overlap pulse p3 is generated.

In the pulse generation circuit 12-5, for example, the D-type flip-flop with asynchronous reset DFF15 is set at the clock ck8 and reset at the clock ck9, consequently, the non-overlap pulse p4 is generated.

Since the pulses p0 to p4 generated by the pulse generation circuits 12-1 to 12-5 do not overlap, by obtaining an OR in the OR circuit 13, "p0+p1+p2+p3+p4" becomes a clock waveform.

Consequently, the original clock generation circuit is suppressed to 400 MHz and a clock equivalent to 2 GHz can be obtained.

As explained above, however, when communicating via a serial interface IEEE1394, particularly in a system where the cable is made a long one of for example 100 m, a 400 MHz clock is required for data-strobe coding.

In addition to this, a clock of 500 MHz (400×5/4 or ×10/8) is also required when increasing a length of a communication cable by changing a bit coding format to a 4B/5B system of communicating by changing 4 bits of data to 5 bits of symbols or to a 8B/10B system of communicating by changing 8 bits of data to 10 bits of symbols (work for standardization is actually underway as P1394B in the IEEE).

When 400 MHz clocks and 500 MHz clock are necessary, generating a 2 GHz clock once means to handle a 2 GHz signal. Thus, it can be considered that design becomes difficult or the operation becomes unstable when the gate delay is equal for a 2 GHz clock period.

Therefore, the configuration for generating a 500 MHz clock without using a 2 GHz clock will be explained with reference to the drawings below.

FIGS. 10A to 10K are views comparing 400 MHz 10-phase clocks ck0 to ck9 with a 500 MHz clock CK500.

Figure 10:
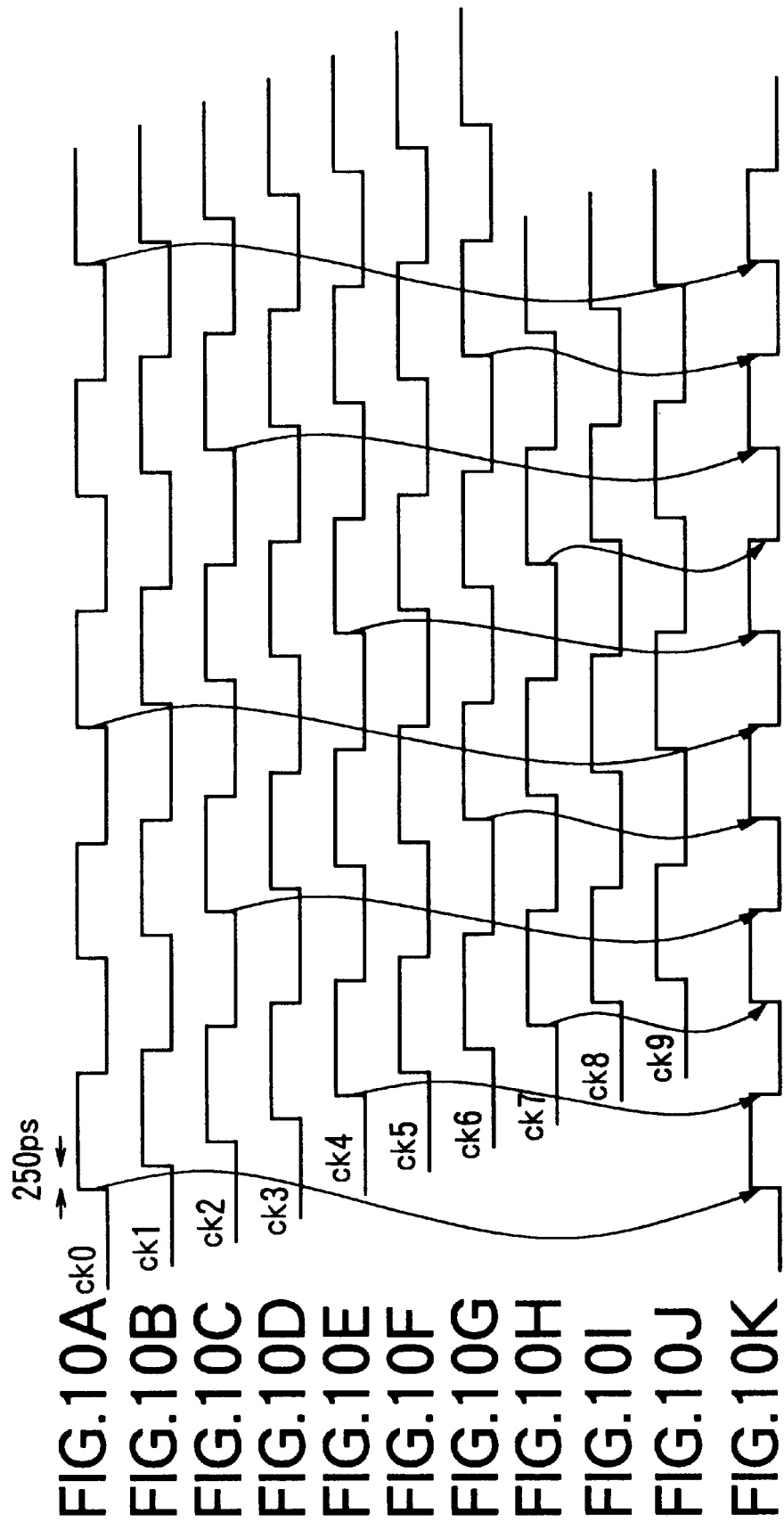
FIGS. 10A to 10K are views comparing 400 MHz 10-phase clocks ck0 to ck9 and a 500 MHz clock CK500.

As is understood from FIG. 10, a 500 MHz clock CK500 can be generated by repeating the next cycle.

Namely, an operation of setting at ck0→resetting at ck4→setting at ck8→resetting at ck2→setting at ck2→resetting at ck0→setting at ck4→resetting at ck8→setting at ck2→resetting at ck6 is repeated.

This cycle is repeated at the least common multiple 10 ns of 1/400 MHz (2.5 ns) and 1/500 MHz (2.0 ns). Since the clocks ck1, ck3, ck5, and ck7 are not used, the explanation thereof will be omitted below.

Figure 11:
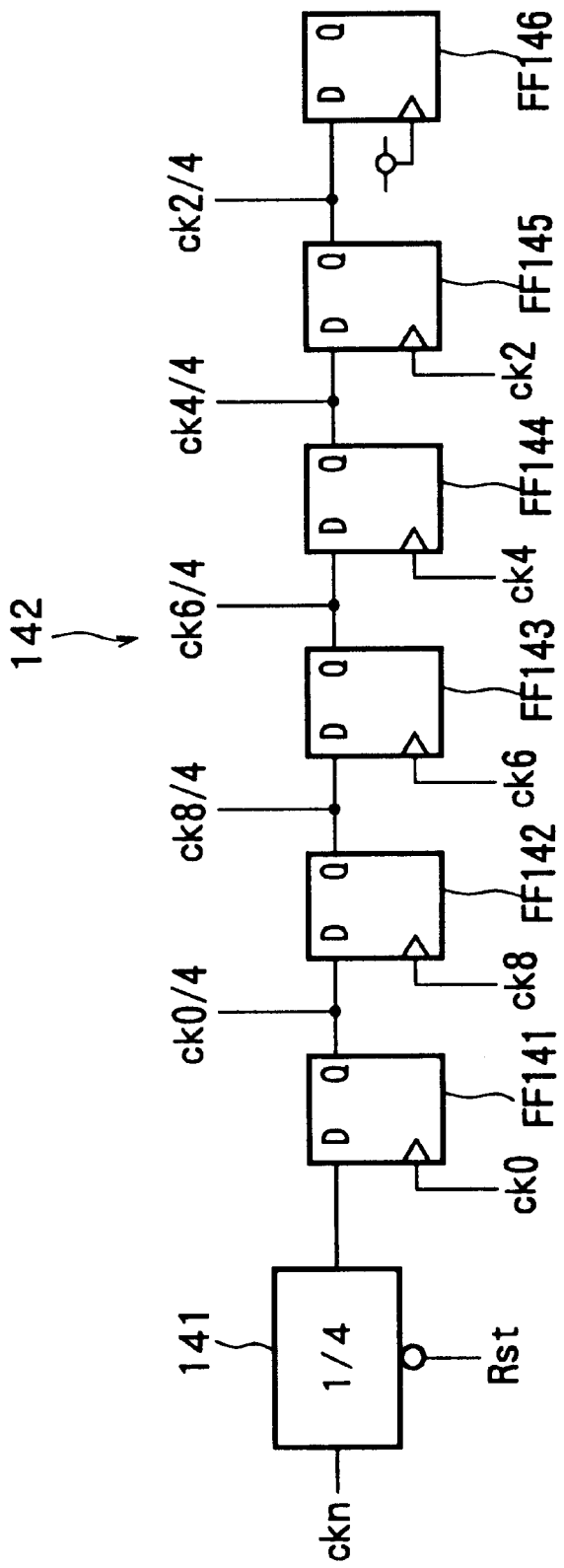
FIG. 11 is a circuit diagram of an example of the configuration of a multiphase clock generation circuit at the time of generating a 500 MHz clock from 400 MHz 10-phase clocks.

FIG. 11 is a circuit diagram of an example of the configuration of a multiphase clock generation circuit required for such an operation.

The multiphase clock generation circuit 14 comprises, as shown in FIG. 11, a shifter 142 including a frequency divider 141 and D-type flip-flops FF141 to FF146 whose D-inputs and Q-outputs are serially connected.

Note that the final flip-flop FF146 of the shifter is used as a dummy for matching loading in the multiphase clock generation circuit 14.

In the multiphase clock generation circuit 14, for example, a suitable clock ckn (n is any of 0 to 9) among the 400 MHz clocks generated in the PLL circuit of FIG. 3 is divided into four at the frequency divider 141 first.

This is shifted in order by the flip-flops FF141 to FF145 based on the clocks ck0, ck4, ck8, ck2, and ck6 in that order.

As a result, 5 clocks having a necessary frequency of 100 MHz, that is, clocks ck0/4, ck8/4, ck6/4, ck4/4, and ck2/4, are obtained in a desired phase order as shown in FIGS. 12A to 12H.

Then, as shown in FIGS. 11 and 12, the pulse p0 is obtained by setting at a rising edge of the clock ck0/4 and resetting at a trailing edge of the clock ck4/4, the pulse p1 is obtained by setting at a rising edge of the ck8/4 and resetting at a trailing edge of the clock ck2/4, and a 500 MHz clock is obtained by generating the pulses p2, p3, and p4 in the same way and obtaining an OR thereof.

Note that in FIG. 12, "Rst" is a reset signal of the ¼ frequency divider 141 and waveforms of p2, p3, and p4 are omitted.

It can be learned that the non-overlap pulse can be correctly generated from the third cycle in this circuit.

The first two cycles do not give the desired waveform. If necessary, it is easy to output the waveform starting from the third cycle by disabling the OR circuit 13 for the first two cycles.

FIG. 13 is a circuit diagram of an overall clock generation circuit other than a multiphase clock generation circuit at the time of generating a 500 MHz clock from a 400 MHz 10-phase clocks.

As shown in FIG. 13, the pulse generation circuits 12A-1 to 12A-5 are respectively comprised of D-type flip-flops DFF11A to DFF15A with asynchronous reset.

Specifically, in the pulse generation circuit 12A-1, the D-input of the flip-flop DFF11A is fixed to a logic of "1", the clock ck0/4 is supplied to the clock terminal CK, the clock ck4/4 is supplied to the reset terminal R, and the non-overlap pulse p0 is output from the Q-output.

In the pulse generation circuit 12A-2, the D-input of the flip-flop DFF12A is fixed to a logic of "1", the clock ck8/4 is supplied to the clock terminal CK, the clock ck2/4 is supplied to the reset terminal R, and the non-overlap pulse p1 is output from the Q-output.

In the pulse generation circuit 12A-3, the D-input of the flip-flop DFF13A is fixed to a logic of "1" the clock ck6/4 is supplied to the clock terminal CK, the clock ck0/4 is supplied to the reset terminal R, and the non-overlap pulse p2 is output from the Q-output.

In the pulse generation circuit 12A-4, the D-input of the flip-flop DFF14A is fixed to a logic of "1", the clock ck4/4 is supplied to the clock terminal CK, the clock ck8/4 is supplied to the reset terminal R, and the non-overlap pulse p3 is output from the Q-output.

In the pulse generation circuit 12A-5, the D-input of the flip-flop DFF15A is fixed to a logic of "1", the clock ck2/4 is supplied to the clock terminal CK, the clock ck6/4 is supplied to the reset terminal R, and the non-overlap pulse p4 is output from the Q-output.

Since the pulses p0 to p4 respectively generated by the pulse generation circuits 12A-1 to 12A-5 do not overlap, "p0+p1+p2+p3+p4" becomes the 500 MHz clock waveform by obtaining an OR in the OR circuit 13.

As a result, a 500 MHz clock and clocks not having a simple whole multiple relationship can be generated with respect to a 400 MHz clock.

Generally, a clock equal to the least common multiple of an original frequency and a period to be obtained is generated from the original clock by division, this is shifted for the required stages in that order by a clock of the original multiphase clock having a half phase difference of a period of a frequency sought, and a non-overlap pulse is generated by setting and resetting by using the respective shifter outputs to obtain an OR. Consequently, a clock having a frequency of $f_{out}$ expressed by formula (1) can be generated.

$$f_{out}=(f_0/M)\cdot(N/2) \quad (1)$$

Here, $f_0$ is an original multiphase clock frequency, N indicates the number of phases of the multiphase clocks (N is an even number), and M indicates a dividing ratio.

In the above example of generating a 2 GHz clock, $f_{out}$=2 GHz when $f_0$=400 MHz, N=10, and M=1.

Also, in an example of generating a 500 MHz clock, $f_{out}$=500 MHz by setting M=4.

Particularly, a case where $f_0$ is a bit rate and $f_{out}$ is a symbol rate of 4B/5B or 8B/10B is important.

For the IEEE1394, a clock of 2 GHz, 1 GHz, 500 MHz, 250 MHz, and 125 MHz of an 8B/10B system can be generated from a DS system clock $f_0$=400 MHz by setting N=10 and M=1, 2, 4, 8, 16.

Conversely, it is possible to generate a 400 MHz system based on 500 MHz since $f_{out}$=400 MHz can be generated by setting $f_0$=500 MHz, N=8, M=5.

Note that when N=8, the number of stages of the ring oscillator becomes 4 m (m is a natural number) which is an even number of stages, but this can be overcome by using differential-delay cells.

When the OR circuit suffers from fluctuation in the delay from the edges, this appears as jitter of the generated clock, so a circuit of FIG. 9 which is symmetrical with respect to the inputs is preferable.

The symmetry in the frequency divider and pulse generation circuits is clear in the example described here.

As explained above, according to the present embodiment, since provision is made of a multiphase clock generation circuit 11 for generating multiphase clocks of a predetermined frequency, pulse generation circuits 12-1 to 12-n for generating non-overlap using a part of the multiphase clocks From the multiphase clock generation circuit 11, and an OR circuit 13 for obtaining an OR of a plurality of non-overlap pulses p0 to pn from the pulse generation circuits 12-1 to 12-n, a clock having a different frequency from the multiphase clocks, particularly a clock not having a simple whole multiple relationship such as 500 MHz with respect to 400 MHz, or a clock of a higher frequency can be obtained without resulting in an increase of the current consumption and chip area.

In other words, a clock having a high frequency (difficult to attain by a PLL obtained by device technique to be used) can be generated from a clock source such as a PLL having a lower frequency (possible in the device).

Also, a clock of a frequency f1 not having a simple whole multiple ratio relationship (simply meaning that it cannot be obtained by a frequency divider) with respect to a frequency $f_0$ of the clock generation circuit (note that it is not any ratio, but is determined by the dividing ratio of the number of phases of the original clock and the frequency divider) can be generated.

Furthermore, since no analog circuits are used and the circuit can be realized by combining logic circuits, it is unnecessary to handle a high frequency in the middle, for example, a frequency of the least common multiple of $f_0$ and f1.

Summarizing the effects of the invention, as explained above, according to the present invention, it is possible to obtain a clock of a frequency of not a simple whole multiple ratio relationship or a higher frequency without causing an increase of power consumption and the chip area.

Particularly, since an IEEE1394B or other DS system and 8B/10B or 4B/5B system clock can be generated from a generation circuit (PLL) having one of the frequencies, interferences by a plurality of PLLs can be prevented, the operation of the LSI becomes stable, and, since a single PLL is enough, a low cost is attainable and the power consumption can be reduced.

While the invention has been described with reference to specific embodiment chosen for purpose of illustration, it should be apparent that numerous modifications could be made thereto by those skilled in the art without departing from the basic concept and scope of the invention.

What is claimed is:

1. A clock generation circuit, comprising
a multiphase clock generation circuit for generating multiphase clocks of a predetermined frequency,
pulse generation circuits for generating a plurality of non-overlap pulses by using at least a part of the multiphase clocks of the multiphase clock generation circuit, and
a combining circuit for combining a plurality of non-overlap pulses of said pulse generation circuits to generate a clock having a different frequency from that of said multiphase clocks.

2. A clock generation circuit as set forth in claim 1, wherein said multiphase clock generation circuit comprises a phase synchronization circuit including a phase comparison means for comparing a reference signal with an internal signal and outputting a control signal in accordance with a comparison result and an oscillator, including a basic ring oscillator comprised of a plurality of differential delay circuits adjusted in delay time in accordance with at least said control signal and connected in a ring, generating a multiphase clock based on outputs of a plurality of differential delay circuits.

3. A clock generation circuit as set forth in claim 1, wherein said multiphase clock generation circuit includes a phase synchronization circuit including a phase comparison means for comparing a reference signal with an internal signal and outputting a control signal in accordance with a comparison result and an oscillator, including a basic ring oscillator comprising an odd number of inverted delay circuits adjusted in delay time in accordance with at least with said control signal and connected in a ring, generating a multiphase clock by dividing outputs of the ring oscillator.

4. A clock generation circuit as set forth in claim 1, wherein each of said pulse generation circuits comprises a generation means for generating a non-overlap pulse by being set at a clock edge and reset at another clock edge among the multiphase clocks of said multiphase clock generation circuit.

5. A clock generation circuit as set forth in claim 4, wherein said generation means comprises an asynchronous reset type flip-flop.

6. A clock generation circuit as set forth in claim 4, wherein said generation means comprises an RS-type latch circuit.

7. A clock generation circuit as set forth in claim 1, wherein said combining circuit comprises an OR circuit.

8. A clock generation circuit as set forth in claim 7, wherein said OR circuit is comprised of a wired OR circuit having a normally-on load.

9. A clock generation circuit, comprising:
a multiphase clock generation circuit having a generation portion for generating reference multiphase clocks having a predetermined frequencies $f_0$, a frequency divider for dividing by a dividing ratio M a frequency of one clock among the reference multiphase clocks of said generation portion, and a shifter for shifting a dividing signal of said frequency divider by reference multiphase clocks;
pulse generation circuits for generating a plurality of non-overlap pulses by using at least a part of the multiphase clocks output by said multiphase clock generation circuit; and
a combining circuit for combining a plurality of non-overlap pulses by said pulse generation circuits to compose a clock having a different frequency $f_{out}$ from that of said reference multiphase clocks.

10. A clock generation circuit as set forth in claim 9, wherein
the dividing ratio M of the frequency divider of said multiphase clock generation circuit is set to be value giving a clock equal to the least common multiple of the original frequency $f_0$ and the period sought;
said shifter obtains a multiphase clock by shifting by the number of stages required by the original reference multiphase clock having a half phase difference of a period of a frequency $f_{out}$ to be obtained in said combining circuit in that order; and
said combining circuit generates a clock satisfying $f_{out} = (f_0/M) \cdot (N/2)$.

11. A clock generation circuit as set forth in claim 9, wherein said multiphase clock generation circuit comprises a phase synchronization circuit including a phase comparison means for comparing a reference signal with an internal signal and outputting a control signal in accordance with a comparison result and an oscillator, including a basic ring oscillator comprised of a plurality of differential delay circuits adjusted in delay time in accordance with at least said control signal and connected in a ring, generating a multiphase clock based on outputs of a plurality of differential delay circuits.

12. A clock generation circuit as set forth in claim 9, wherein said multiphase clock generation circuit includes a phase synchronization circuit including a phase comparison means for comparing a reference signal with an internal signal and outputting a control signal in accordance with a comparison result and an oscillator, including a basic ring oscillator comprising an odd number of inverted delay circuits adjusted in delay time in accordance with at least with said control signal and connected in a ring, generating a multiphase clock by dividing outputs of the ring oscillator.

13. A clock generation circuit as set forth in claim 9, wherein each of said pulse generation circuits comprises a generation means for generating a non-overlap pulse by being set at a clock edge and reset at another clock edge among the multiphase clocks of said multiphase clock generation circuit.

14. A clock generation circuit as set forth in claim 13, wherein said generation means comprises an asynchronous reset type flip-flop.

15. A clock generation circuit as set forth in claim 13, wherein said generation means comprises an RS-type latch circuit.

16. A clock generation circuit as set forth in claim 9, wherein said combining circuit comprises an OR circuit.

17. A clock generation circuit as set forth in claim 16, wherein said OR circuit is comprised of a wired OR circuit having a normally-on load.

18. A clock generation circuit, comprising:

means for generating multiphase clocks of a predetermined frequency;

means for generating a plurality of non-overlap pulses using at least a part of said multiphase clocks; and, means for generating at least two clocks from said plurality of non-overlap pulses, said two clocks having two different frequencies, both of which differ from said predetermined frequency of said multiphase clocks, said two clock frequencies having a relationship where the higher frequency is not whole number multiple of the lower frequency.

* * * * *

UNITED STATES PATENT AND TRADEMARK OFFICE
CERTIFICATE OF CORRECTION

PATENT NO. : 6,388,492 B2
DATED : May 14, 2002
INVENTOR(S) : Kiyoshi Miura

It is certified that error appears in the above-identified patent and that said Letters Patent is hereby corrected as shown below:

Column 11,
Line 50, remove "with".

Column 12,
Line 50, remove "with".

Signed and Sealed this

Eleventh Day of February, 2003

JAMES E. ROGAN
*Director of the United States Patent and Trademark Office*